United States Patent
Zhou

(10) Patent No.: US 9,524,212 B2
(45) Date of Patent: Dec. 20, 2016

(54) METHOD, DEVICE AND OPERATING SYSTEM FOR PROCESSING AND USING BURN DATA OF NAND FLASH

(71) Applicant: MStar Semiconductor, Inc., Hsinchu Hsien (TW)

(72) Inventor: Tao Zhou, Shanghai (CN)

(73) Assignee: MSTAR SEMICONDUCTOR, INC., Hsinchu Hsien (TW)

( * ) Notice: Subject to any disclaimer, the term of this patent is extended or adjusted under 35 U.S.C. 154(b) by 148 days.

(21) Appl. No.: 14/584,653

(22) Filed: Dec. 29, 2014

(65) Prior Publication Data
US 2015/0186211 A1    Jul. 2, 2015

(30) Foreign Application Priority Data
Dec. 30, 2013  (CN) .......................... 2013 1 0746872

(51) Int. Cl.
| | | |
|---|---|---|
| *G06F 11/10* | (2006.01) | |
| *G06F 12/02* | (2006.01) | |
| *G06F 11/07* | (2006.01) | |
| *G11C 29/52* | (2006.01) | |
| *G11C 16/20* | (2006.01) | |

(52) U.S. Cl.
CPC ......... *G06F 11/1072* (2013.01); *G06F 11/076* (2013.01); *G06F 11/1068* (2013.01); *G06F 12/0246* (2013.01); *G11C 16/20* (2013.01); *G11C 29/52* (2013.01); *G06F 2212/403* (2013.01); *G06F 2212/7209* (2013.01)

(58) Field of Classification Search
CPC .............. G06F 11/1072; G06F 11/1068; G06F 12/0246; G06F 11/076; G06F 2212/403; G06F 2212/7209; G11C 16/20; G11C 29/52
USPC ................. 714/52, 718, 742, 746, 763, 773; 365/230.03, 201, 185.09, 185.11, 185.29
See application file for complete search history.

(56) References Cited

U.S. PATENT DOCUMENTS

| | | | | |
|---|---|---|---|---|
| 6,198,663 | B1* | 3/2001 | Takizawa ................ | G06F 11/24 365/185.29 |
| 6,457,126 | B1* | 9/2002 | Nakamura .............. | G06F 21/79 380/277 |
| 9,128,624 | B2* | 9/2015 | Ng .......................... | G06F 3/061 |
| 2004/0151055 | A1* | 8/2004 | Shieh .................. | G06F 12/0246 365/238.5 |
| 2004/0193786 | A1* | 9/2004 | Inagaki ............... | G06F 12/0246 711/105 |
| 2006/0253750 | A1* | 11/2006 | Kondou ................ | G11C 29/16 714/718 |
| 2008/0106958 | A1* | 5/2008 | Kwon .................... | G11C 29/16 365/201 |

(Continued)

Primary Examiner — John J Tabone, Jr.
(74) Attorney, Agent, or Firm — WPAT, PC; Justin King

(57) ABSTRACT

A method for processing burn data of NAND flash is provided. The method includes: identifying all half-empty blocks in the burn data of the NAND flash, the half-empty blocks being blocks in which a part of pages are written with data and the remaining part of pages being blank pages; writing a predetermined label character to all the blank pages of the all the half-empty blocks to convert the half-empty blocks to full blocks. With the above approach, the present invention fulfills the requirement that every page is either empty or written with data, so as to prevent from damaging data in a high-temperature patching process to thereby enhance product quality and reliability.

13 Claims, 2 Drawing Sheets

(56) References Cited

U.S. PATENT DOCUMENTS

| | | | |
|---|---|---|---|
| 2009/0228634 A1* | 9/2009 | Nakamura | G06F 11/1068 711/103 |
| 2010/0008170 A1* | 1/2010 | Sato | G11C 29/56004 365/201 |
| 2011/0145480 A1* | 6/2011 | Ng | G06F 3/061 711/103 |
| 2011/0299317 A1* | 12/2011 | Shaeffer | G11C 13/0002 365/106 |
| 2013/0103992 A1* | 4/2013 | Chang | G11C 29/56 714/718 |
| 2013/0145085 A1* | 6/2013 | Yu | G06F 12/0246 711/103 |
| 2013/0238835 A1* | 9/2013 | Liu | G11C 29/822 711/103 |
| 2015/0106557 A1* | 4/2015 | Yu | G06F 12/0246 711/103 |
| 2015/0168490 A1* | 6/2015 | Douskey | G01R 31/3177 714/726 |

* cited by examiner

METHOD, DEVICE AND OPERATING SYSTEM FOR PROCESSING AND USING BURN DATA OF NAND FLASH

This application claims the benefit of People's Republic of China application Serial No. 201310746872.8, filed Dec. 30, 2013, the subject matter of which is incorporated herein by reference.

BACKGROUND OF THE INVENTION

Field of the Invention

The invention relates in general to a computer data storage field, and more particularly, to a method, device and operating system for processing and using burn data of NAND flash.

Description of the Related Art

NAND flash features large capacity, fast access speed, and low cost per unit capacity, and is thus more and more commonly applied as a carrier for data storage. Although NAND flash is advantaged from capacity and cost aspects among various flash memories, it however suffers from a drawback of unsatisfactory reliability.

NAND flash may be categorized into two types—single-level cell (SLC) and multi-level cell (MLC) devices. An SLC device stores one-bit information per storage unit, and an MLC device stores two-bit information per storage unit, giving the MCL device a natural cost-wise advantage. As the market demand for NAND flash grows, the application of MLC devices also becomes more extensive. However, due to a special physical structure of MLC devices, the reliability of MLC devices is much poorer than that of SLC devices. Therefore, there is a need for a solution that enhances the reliability of MLC devices while maintaining the cost advantage.

During mass production of NAND flash, burn data is written into the NAND flash using a dedicated burner, and the NAND flash is then adhered onto a circuit board by a high-temperature patching process. However, the high-temperature patching process may damage the written data in the NAND flash to result in product quality degradation.

SUMMARY OF THE INVENTION

The technical issue of the present invention is to provide a method, device and system for processing and using burn data of NAND flash, such that not only low-cost multi-level cell (MLC) NAND flash devices may be applied in large-scale to products, but also production efficiency and reliability of NAND flash are at the same time ensured.

To solve the above technical issue, the present invention provides a method for processing burn data of NAND flash. Before burning data, the method includes: identifying all half-empty blocks in the burn data of the NAND flash, the half-empty blocks being blocks in which a part of pages are written with data and the remaining part of pages being blank pages in the burn data; writing a predetermined label character to all the blank pages of the all the half-empty blocks to convert the half-empty blocks to full blocks. The full blocks are blocks in which every page is written with data. The predetermined label character is used for distinguishing the blocks written with the predetermined label character from other full blocks.

To solve the above technical issue, the present invention provides a method for using NAND flash. The method includes: when a system is powered on, determining whether a predetermined label character is present in a block of burn data of the NAND flash, the predetermined label character being used for distinguishing half-empty written with the predetermined label character from other full blocks; when the predetermined label character is present in the block of the burn data of the NAND flash, writing valid data in the block with the predetermined label character to an empty block, and erasing the block with the predetermined label character.

To solve the above technical issue, the present invention provides a device for processing burn data of NAND flash. The device includes an identification module and a writing module. The identification module identifies all half-empty blocks in the burn data of the NAND flash, the half-empty blocks being blocks in which a part of pages are written with data and the remaining part of pages being empty in the burn data. The writing module writes a predetermined label character to all the blank pages in the half-empty blocks to convert the half-empty blocks to full blocks. The full blocks are blocks in which every page is written with data. The predetermined label character is used for distinguishing the block written with the predetermined label character from other full blocks.

To solve the above technical issue, the present invention provides an operating system for NAND flash. The operating system includes a determination module and a processing module. When a system is powered on, the determination module determines whether a predetermined label character is present in the block of the burn data of the NAND flash. The predetermined label character is used for distinguishing the block written with the predetermined label character from other full blocks. When the predetermined label character is present in the block of the burn data of the NAND flash, the processing module writes valid data in the block with the predetermined label character to an empty block, and erases the block with the predetermined label character.

The present invention provides following effects. Different from known technologies, before burning data, the present invention identifies all half-empty blocks in which a part of pages are written with data and the remaining part of pages are blank pages from the burn data of NAND flash, and writes a predetermined label character to all the blank pages of all the half-empty blocks. Thus, the half-empty blocks are converted to full blocks in which every page is written with data. The predetermined label character is used for distinguishing the block written with the predetermined label character from other full blocks. Through the above method, half-empty blocks are processed, so that blocks of burn data fulfill the requirement that every page is either empty or written with data, thereby preventing a high-temperature patching process from damaging burn data and thus enhancing product quality and reliability.

The above and other aspects of the invention will become better understood with regard to the following detailed description of the preferred but non-limiting embodiments. The following description is made with reference to the accompanying drawings.

DETAILED DESCRIPTION OF THE INVENTION

Figure 1:
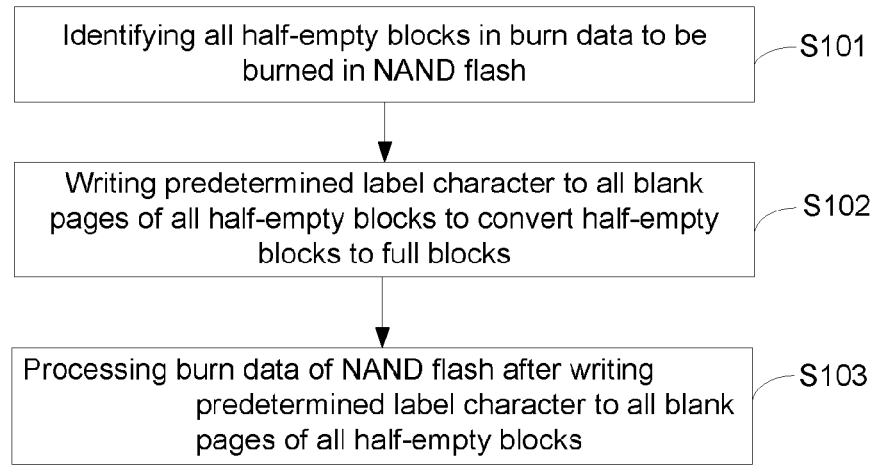
FIG. 1 is a flowchart of a method for processing burn data of NAND flash according to an embodiment of the present invention.

FIG. 1 shows a flowchart of a method for processing burn data of NAND flash according to an embodiment of the present invention. Referring to FIG. 1, the method for processing burn data of NAND flash according to an embodiment includes following steps.

In step S101, all half-empty blocks in the burn data to be burned in the NAND flash are identified.

Before burning data, the burn data to be burned in the NAND flash is processed. This is to fulfill the requirement that every page of all data blocks of the burn data is either empty or written with data and to prevent any block from being half-empty. A half-empty block refers to a block containing a part of pages that are written with data while the remaining part of pages are blank. Therefore, to process the burn data, half-empty blocks in the burn data need to be first identified.

The pages in the burn data may be sequentially read to identify all the half-empty blocks in the burn data.

For an MLC NAND flash device, data is generally written to a block in an onward order of front to back. Thus, for one half-empty block, the front part is stored with data while the rear part is an empty region. By using such feature, the efficiency of identifying half-empty blocks can be increased. If the first page of one block is a blank page, it can be determined that this block is an empty block that is not at all used, and subsequent pages of this block need not be further determined. If it is determined in an onward order that a certain page in the middle is a blank page, it can be determined that this block is a half-empty block, and subsequent pages of this block need not be further determined. To increase the speed, when it is determined in an onward order that the first page contains data, it is immediately determined whether the last page contains data. If that last page does not contain any data, it is determined that the block is a half-empty block, or else it is determined that the block is a full block. Thus, the efficiency for identifying the half-empty blocks in the burn data of the MLC NAND flash device can be increased.

In step S102, a predetermined label character is written into all blank pages of all half-empty blocks to convert the half-empty blocks into full blocks.

Burn data is generally written into NAND flash by a burner. The burner is in charge of the burning process, and burns exact data provided by a user. As a default value of erased NAND flash is 1, when values of a page in burn data are all 1, it can be determined that this page is a blank page. Before the burner writes data to NAND flash, the entire NAND flash is erased. Thus, in order to accelerate the speed of burning, the burner skips the burning process of a certain page if it finds that this page in the burn data is empty, and a corresponding position in the NAND flash is naturally kept in an empty-page state after the erasing operation.

For an MLC NAND flash device, only when an entire block is empty, the burning process may then skip the block. Although a half-empty block also contains blank pages, such blank pages cannot be skipped, and every page of these blank pages needs to be forcibly burned. Therefore, a half-empty block needs to be processed to prevent it from being skipped in the burning process.

In an embodiment of the present invention, a predetermined label character is written into all blank pages of all half-empty blocks to convert the half-empty blocks into full blocks. The predetermined label character is used for distinguishing a block written with the predetermined label character from other full blocks.

In one preferred embodiment of the present invention, the predetermined label character may be written to a predetermined bit at the beginning of all blank pages of all half-empty blocks.

Further, for product performance, an issue of an error correction code (ECC) of NAND flash may be considered as follows. Due to the less satisfactory reliability of NAND flash, the ECC needs to be added to every page to ensure the intactness of user data. The ECC is generated while writing data, and is altogether written into the NAND flash with the user data. When reading data, the ECC value is again calculated and the newly generated ECC value is compared with the ECC value previously written to determine whether the data is damaged. The ECC has a certain level of error correction capability. When the bit count of an error does not exceed the error correction capability of the ECC algorithm, the damaged data can be corrected.

To prevent the system from reporting an ECC error as a result of the predetermined label character written into all the blank pages of the half-empty blocks when these pages are later read, in one preferred embodiment, the predetermined label character is written into all the blank pages of the half-empty blocks by the approach below. The predetermined label character 0 is written into first several bits of all the blank pages of the half-empty blocks, and the bit count of the predetermined label character is controlled within the bit count range that can be corrected by the ECC (i.e., the bit count of the predetermined label character is smaller than or equal to the bit count of the ECC error correction capability). For example, when the ECC error correction capability is 10 bits, the bit count of the predetermined label character written in may be any bit count that is smaller than or equal to 10. For the sake of simplicity, the predetermined label character may be written into the first one bit of each page.

Thus, the ECC value need not be again calculated. During system initialization, when these processed blank pages of the half-empty pages are read, not only actual data can be kept from damages, but also these half-empty blocks that are previously labeled can be identified.

When the burner burns the above processed burn data, the burner encounters either totally empty blocks or blocks in which all pages are written with data. Thus, the burner performs a complete writing process for the blocks in which all pages are written with data, and skips the totally empty blocks.

In step S103, after the predetermined label character is written into all the blank pages of all the half-empty blocks, the burn data of the NAND flash is processed.

It can be understood through the above description of the embodiment that, before burning data, the method for processing burn data of NAND flash according to an embodiment of the present invention identifies all the half-empty blocks in which a part of pages are written with data and the remaining part of pages are blank for the burn data of the NAND flash, and writes the predetermined label character to all the blank pages of all the half-empty blocks, so that the half-empty blocks are converted to full blocks in which every page is written with data. The predetermined label character is used for distinguishing the blocks written with the predetermined label character from other full blocks. Through the above approach, the half-empty blocks are processed, so that the blocks of the burn data fulfill the requirement that every page is either empty or written with data, thereby preventing a high-temperature patching process from damaging burn data and thus enhancing product quality and reliability.

Further, in one preferred embodiment, the bit count of the predetermined label character written to the blank pages of the half-empty pages is controlled with an ECC error correction capability range. Thus, when these pages are later read, not only actual data can be kept from damages, but also these processed pages can be readily identified to reuse these pages.

Further, after the predetermined label character that can be corrected by ECC is written into the first several bits of all the blank pages of the half-empty blocks, an ECC code may be disposed into a page without the predetermined label character, so as to quickly identify the full blocks written with the predetermined label character according to the features of without the ECC code and written bit(s) in the subsequent system initialization. In other embodiments, the ECC may be provided at the same time when writing the predetermined label character. At this point, in the page written with the predetermined label character, no other data is present apart from the predetermined label character. Such feature is for identifying that this block is a full block written with the predetermined label character. In the event that the predetermined label character is also present at the beginning of the corresponding page of other full blocks without the predetermined label character, the predetermined label character is followed by data under such circumstances. Therefore, such feature may be used to determine that this block is a full block without the predetermined label character.

In the approach of distinguishing full blocks written with the predetermined label character of the present invention, the predetermined label character is not limited to the above predetermined value 0. Other designs such as an identifiable character arrangement or character content may also be applied to distinguish full blocks written with the predetermined label character from other full blocks without the predetermined label character.

Further, the order for reading the NAND flash is not limited to the exemplary onward order in the present invention, and may be a reverse order of back to front under appropriate circumstances. Correspondingly, the approach of distinguishing full blocks written with the predetermined label character need to be adaptively adjusted.

Figure 2:
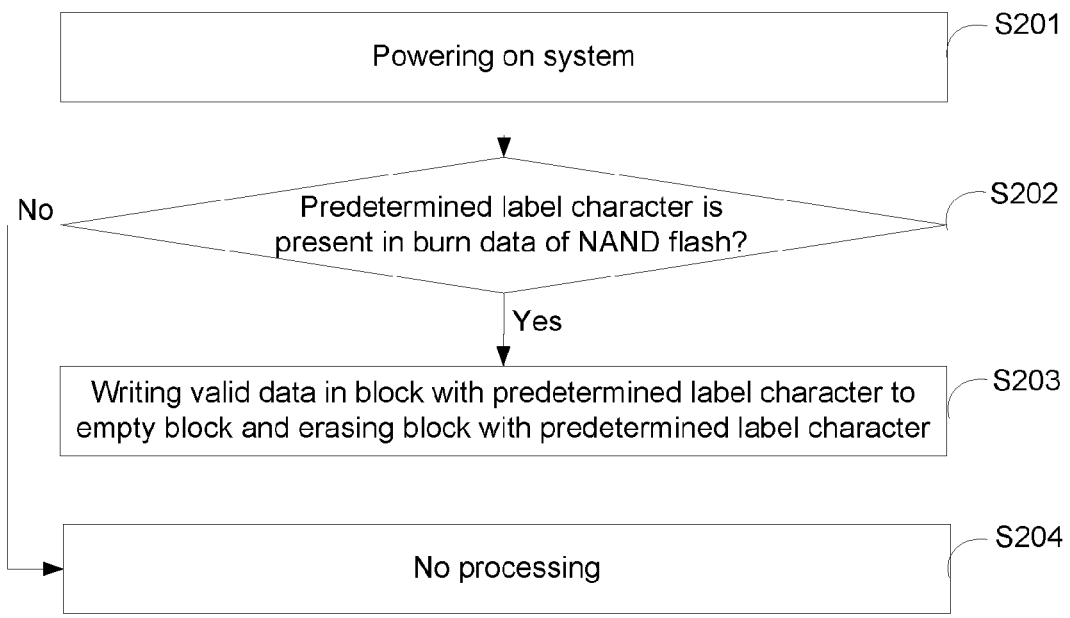
FIG. 2 is a flowchart of a method for using NAND flash according to an embodiment of the present invention.

FIG. 2 shows a flowchart of a method for using NAND flash according to an embodiment of the present invention. Referring to FIG. 2, the method for using NAND flash according to an embodiment includes following steps.

In step S201, the system is powered on.

When the system is powered on, each block of the NAND flash is read to obtain information associated with the file system.

In step S202, it is determined whether a predetermined label character is present in the blocks of burn data of the NAND flash.

By reading the data in each block of the NAND flash, it is determined whether the predetermined label character is present in the blocks of the burn data of the NAND flash.

Originally, first two pages of each block are usually read when the system is powered on. In one preferred embodiment of the present invention, for an MLC NAND flash device, to identify originally half-empty blocks in the burn data, since blocks are written with the predetermined label character when the data is burned, the blocks written with the predetermined label character are first read, and the last page of the blocks of the burn data is then read. As a block in an MLC NAND flash device needs to be read in an onward order of front to back, a correctable ECC result is usually obtained after reading the last page of a previously labeled empty region at a rear half of an empty block. When a correctable ECC result is obtained, it is deemed that a half-empty block in which the predetermined label character is read.

To better find data blocks with the predetermined label character, the predetermined label character is set to 0, and the bit count of the predetermined label character is controlled to be smaller than or equal to the bit count within the error correction capability. Thus, when an ECC result is obtained after reading the last page of a certain block, this page is already corrected by the ECC process, and so the rear half of the labeled empty block is logically a blank page that does not contain the previously labeled predetermined label character 0.

A dedicated empty block may be used to record block information of a block written with the predetermined label character that is found after the system is powered on. In subsequent boot processes, the boot speed can be accelerated by reading only the last page of blocks without the record.

In step S203, valid data in the block with the predetermined label character is written to an empty block, and the block with the predetermined label character is erased.

The block with the predetermined label character is a half-empty block that is previously labeled, and is however not really half empty and blank pages of this block cannot be directly used to store data. Thus, a restoration process is first performed on the block with the predetermined label character to allow the block to be reused. The restoration process includes duplicating valid data in the block with the predetermined label character, writing the duplicated valid data to an empty block, and erasing the block with the predetermined label character. The erased block can be reused, i.e., data can be directly written therein.

Through the above approach, blank pages of a previously labeled half-empty block can be released and be reused. In the above restoration process, blank pages are generally not duplicated, and so the predetermined label character in a certain bit count originally written in the blank page disappears after the above restoration process.

Duplicating the valid data in the block with the predetermined label character is a reading operation, and writing the valid data to an empty block is a writing operation. For enhanced efficiency, such reading and writing operations can be simultaneously performed. Erasing the block with the predetermined label character can be performed asynchronously at a backstage.

When the block with the predetermined label character in the blocks of burn data is not written by data for a long period of time, before data is written into this block with the predetermined label character, the valid data in this block is written to an empty block during a system idle period, and this block is erased. The above process is completed at the backstage.

Before performing the restoration process on a block with the predetermined label character, the reading and erasing operations can be directly performed; however, the writing operation usually cannot be directly performed. As such, if the writing operation for the block with the predetermined label character needs to be performed before the backstage performs the restoration process, the restoration process may be synchronously, forcibly carried out. Therefore, the restoration process is completed in two situations—completed asynchronously at the backstage to leave a smaller impact on the system performance, and completed before a writing request.

Further, to prevent the restoration process of multiple blocks in a concentrated manner during a boot process from affecting the boot speed, when the restoration process needs to be asynchronously performed at the backstage, it may be designed that the backstage temporarily halts the restoration process when the number of blocks that need to be restored is larger than a predetermined number during a predetermined boot period. The predetermined period and the predetermined number may be configured according to system performance. For example, the backstage is halted from the restoration process when the number of blocks to be restored exceeds 8 within 50 seconds following the beginning of the boot process. For another example, the backstage is halted from the restoration process when the number of blocks to be restored exceeds 10 within 1 minute following the beginning of the boot process.

With the above description of the embodiments, in the method for processing burn data of NAND flash and the method for using NAND flash of the present invention, before burning data, all half-empty blocks in which a part of pages are written with data and the remaining part of pages are blank in the burn data of the NAND flash are identified, and a predetermined label character is written into all the blank pages of the all the half-empty blocks to convert the half-empty blocks to full blocks in which every page is written with data. Thus, it is ensured that the burn data provided to the burner does not contain any half-empty blocks. Further, after the system is powered on, the previously labeled half-empty blocks can be identified and restored, so as to release spaces for reuse and to at the same time minimize the impact on the boot time.

Therefore, the present invention allows low-cost MLC NAND flash devices to be applied in large-scale to products, and is capable of ensuring production efficiency as well as product quality and reliability.

Figure 3:
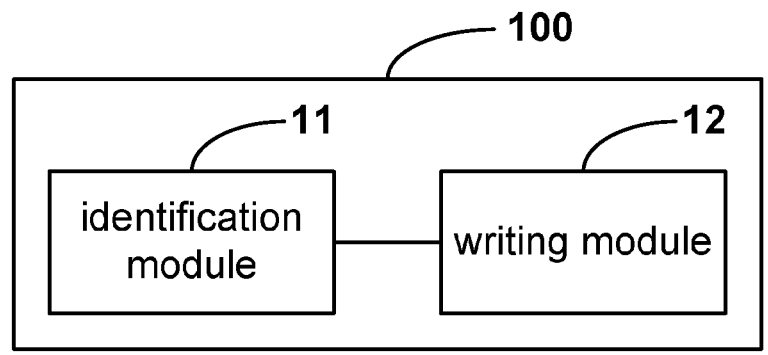
FIG. 3 is a schematic diagram of a device for processing burn data of NAND flash according to an embodiment of the present invention.

FIG. 3 shows a schematic diagram of a device for processing burn data of NAND flash according to an embodiment of the present invention. A device 100 for processing burn data of NAND flash according to an embodiment includes an identification module 11 and a writing module 12.

The identification module 11 identifies all half-empty blocks in the burn data of the NAND flash. A half-empty block is a block in which a part of pages are written with data and the remaining part of pages are blank pages.

Before burning data, the device for processing burn data of NAND flash according to an embodiment of the present invention processes the burn data. Such process is to allow every page of all data blocks of burn data to fulfill the requirement that every page of all data blocks of the burn data is either empty or written with data and to prevent any block from being half-empty. A half-empty block refers to a block containing a part of pages that are written with data while the remaining part of pages are blank. Therefore, to process the burn data, half-empty blocks in the burn data need to be first identified.

The identification module 11 sequentially identifies all half-empty blocks in the burn data by reading the burn data page after page. More specifically, for the blocks in the burn data, the identification module 11 searches through the pages in an onward order of front to back. If the first page of the block contains data and any page subsequent to the first page is blank, it is determined that the block is a half-empty block.

For an MLC NAND flash device, data is generally written to a block in an onward order of front to back. Thus, for one half-empty block, the front part is stored with data while the rear part is an empty region. By using such feature, the efficiency of identifying half-empty blocks can be increased. If the first page of one block is a blank page, it can be determined that this block is an empty block that is not at all used, and subsequent pages of this block need not be further determined. If it is determined in the onward order that a certain page in the middle is a blank page, it can be determined that this block is a half-empty block, and subsequent pages of this block need not be further determined. To increase the speed, when it is determined from front to back that the first page contains data, it is immediately determined that whether the last page contains data. If that last page does not contain any data, it is determined that the block is a half-empty block, or else it is determined that the block is a full block. Thus, the efficiency for identifying the half-empty blocks in the burn data of the MLC NAND flash device can be increased.

The writing module 12 writes a predetermined label character into all the blank pages of all the half-empty blocks to convert the half-empty blocks to full blocks. Full blocks are blocks in which every page is written with data. The predetermined label character is for distinguishing the blocks written with the predetermined label character from other full blocks.

When manufacturing NAND flash, burn data is generally written into flash by a burner. The burner is in charge of the burning process, and burns exact data provided by a user. As a default value of erased NAND flash is 1, when all values of a page in burn data are 1, it can be determined that this page is a blank page. Before the burner writes data to NAND flash, the entire NAND flash is erased. Thus, in order to accelerate the speed of burning, the burner skips the burning process for one page if it finds that this page in the burn data is empty, and a corresponding position in the NAND flash is naturally kept in an empty-page state after the erasing operation.

For an MLC NAND flash device, only when an entire block is empty, the burning process may then skip the block. Although a half-empty block also contains blank pages, such blank pages cannot be skipped, and every page of these blank pages needs to be forcibly burned. Therefore, a half-empty block needs to be processed to prevent it from being skipped in the burning process.

In an embodiment of the present invention, a predetermined label character is written into all blank pages of all half-empty blocks to convert the half-empty blocks into full blocks. The predetermined label character is for distinguishing a block written with the predetermined label character from other full blocks.

In one preferred embodiment, the writing module 12 writes the predetermined label character to a predetermined bit at the beginning of all blank pages of all half-empty blocks. Preferably, the predetermined label character is 0, and the predetermined bit is smaller than or equal to the bit count of the ECC error correction capability. For example, when the ECC error correction capability is 10 bits, the bit count of the predetermined label character written in may be any bit count that is smaller than or equal to 10. Thus, the ECC value need not be again calculated. During system initialization, when these processed blank pages of the half-empty pages are read, not only actual data can be kept from damages, but also these half-empty blocks that are previously labeled can be identified.

When the burner burns the above processed burn data, the burner encounters either totally empty blocks or blocks with all pages written with data. Thus, the burner performs a complete writing process for the blocks with all pages written with data, and skips the totally empty blocks.

After the predetermined label character is written into all the blank pages of all the half-empty blocks, the burn data of the NAND flash is processed.

Figure 4:
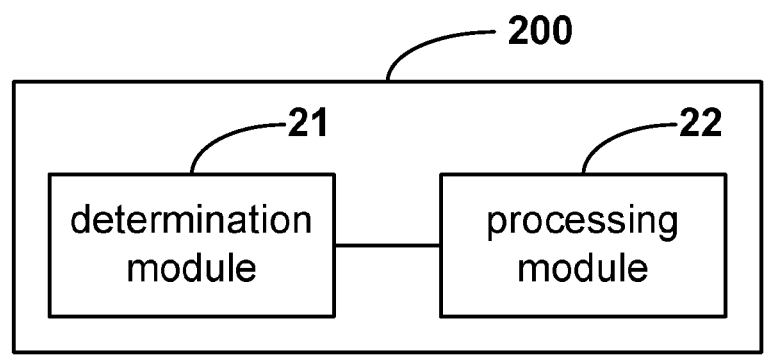
FIG. 4 is a schematic diagram of an operating system for NAND flash according to an embodiment of the present invention.

FIG. 4 shows a schematic diagram of an operating system for NAND flash according to an embodiment of the present invention. An operating system 200 for NAND flash according to an embodiment includes a determination module 21 and a processing module 22.

When the system is powered on, the determination module 21 determines whether a predetermined label character is present in a block of burn data of the NAND flash.

By reading the data in each block of the NAND flash, the determination module 21 determines whether the predetermined label character is present in the blocks of the burn data of the NAND flash.

Originally, first two pages of each block are usually read when the system is powered on. In one preferred embodiment of the present invention, for an MLC NAND flash device, to identify originally half-empty blocks in the burn data, since blocks are written with the predetermined label character when the data is burned, the determination module 21 first reads the two first pages of each block of the burn data and then reads the last page of the blocks of the burn data. When the predetermined label character is present in the last page, it is further determined that the predetermined label character is present in the blocks of the burn data.

As a block in an MLC NAND flash device needs to be read in an onward order of front to back, a correctable ECC result is usually obtained after reading the last page of a previously labeled empty region at a rear half of an empty block. When a correctable ECC result is obtained, it is deemed that a half-empty block in which the predetermined label character is read.

When the predetermined label character is present in the block of the burn data of the NAND flash, the processing module 22 writes valid data in the block with the predetermined label character to an empty block and erases the block with the predetermined label character.

The block with the predetermined label character is a previously labeled half-empty block and is however not really half-empty, and blank pages of the block cannot be directly used for storing data. Therefore, the processing module 22 identifies the block with the predetermined label character, and performs a restoration process on the block with the predetermined label character to allow the block to be reused. The restoration process includes duplicating valid data in the block with the predetermined label character, writing the duplicated valid data to an empty block, and erasing the block with the predetermined label character. The erased block can be used again, i.e., data can be directly written therein.

Through the above approach, blank pages of a previously labeled half-empty block can be released and be reused. In the above restoration process, blank pages are generally not duplicated, and so the predetermined label character in a certain bit count originally written in the blank page disappears after the above restoration process.

Duplicating the valid data in the block with the predetermined label character is a reading operation, and writing the valid data to an empty block is a writing operation. For enhanced efficiency, such reading and writing operations can be simultaneously performed. Erasing the block with the predetermined label character can be performed asynchronously at a backstage.

When the block with the predetermined label character in the blocks of burn data is not written by data for a long period of time, before data is written into this block with the predetermined label character, the processing module 22 writes the valid data in this block to an empty block during a system idle period, and erases this block. The restoration process performed by the processing module 22 is completed at the backstage.

Before performing the restoration process on a block with the predetermined label character, the reading and erasing operations can be directly performed; however, the writing operation usually cannot be directly performed. As such, if the writing operation the block with the predetermined label character needs to be performed before the backstage performs the restoration process, the restoration process may be synchronously, forcibly carried out. Therefore, the restoration process is completed in two situations—completed asynchronously at the backstage to leave a smaller impact on the system performance, and completed before a writing request.

Further, to prevent the restoration process of multiple blocks in a concentrated manner during a boot process from affecting the boot speed, when the restoration process needs to be asynchronously performed at the backstage, the processing module 22 may temporarily halts the backstage from the restoration process when the number of blocks that need to be restored is larger than a predetermined number during a predetermined boot period. The predetermined period and the predetermined number may be configured according to system performance. For example, the backstage is halted from the restoration process when the number of blocks to be restored exceeds 8 within 50 seconds following the beginning of the boot process. For another example, the backstage is halted from the restoration process when the number of blocks to be restored exceeds 10 within 1 minute following the beginning of the boot process.

With the above description of the embodiments, in the method for processing burn data of NAND flash and the method for using NAND flash of the present invention, before burning data, all half-empty blocks in which a part of pages are written with data and the remaining part of pages are blank in the burn data of the NAND flash are identified, and a predetermined label character is written into all the blank pages of the all the half-empty blocks to convert the half-empty blocks to full blocks in which every page is written with data. Thus, it is ensured that the burn data provided to the burner does not contain any half-empty blocks. Further, after the system is powered on, the previously labeled half-empty blocks can be identified and restored, so as to release spaces for reuse and to at the same time minimize the impact on the boot time.

Therefore, the present invention allows low-cost MLC NAND flash devices to be applied in large-scale to products, and is capable of ensuring production efficiency as well as product quality and reliability.

In the embodiments disclosed by the application, it can be understood that the disclosed system, device and method may be implemented by other means. For example, the above device according to the embodiment is illustrative. For example, definitions of the modules or units are logic function definitions, and may be otherwise defined in actual applications. For example, multiple units of elements may be combined or integrated to another system, while certain characteristics may be omitted or left unperformed. Further, indirect coupling, direct coupling or signal connection disclosed or discussed in the description may be implemented via certain indirect coupling or signal connection of certain interfaces, devices or units, and may be implemented in an electrical or mechanical form or other forms.

The units described as discrete components may or may not be physically separate. The components displayed as units may or may not be physical units; that is, these components may be configured at a same location or distributed at multiple network units. One may select one or all of the units to achieve the objects of the embodiments of the present invention.

Further, the functional units in the embodiments may be integrated into one processing unit, or may be physically independent units. Alternatively, two or more these functional units may be integrated into one unit. The above integrated unit may be implemented in form of hardware or software.

When the integrated unit is implemented in form of software that is sold or used as an independent product, such integrated unit may be stored in a computer-readable medium. Base on such understanding, the technical solution of the present invention, or all or a part of the technical solution of the present invention that contributes to the currently known art may be presented in form of software products. The computer software product may be stored in a storage medium, including multiple commands that prompt a computer apparatus (e.g., a personal computer, a server, or a network apparatus) or a processor to execute all or a part of the steps of the methods of the embodiments of the application. The storage medium includes various media capable of storing program codes, such as a portable disk, a flash memory device, a mobile hard disk, a read-only memory (ROM), a random access memory (RAM), a magnetic disk and an optical disk.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A non-transitory computer-readable storage medium with an executable program stored thereon for implementing a method for processing burn data of NAND flash, before burning data, the method comprising:
   identifying all half-empty blocks containing the burn data to be burned in the NAND flash, wherein the half-empty blocks includes both blank pages and non-blank pages;
   writing a predetermined label character to all of the blank pages of all of the half-empty blocks to convert the half-empty blocks to full blocks, wherein the full blocks includes only non-blank pages, and the predetermined label character is used for distinguishing the blocks written with the predetermined label character from other full blocks.

2. The non-transitory computer-readable storage medium according to claim 1, wherein the step of writing the predetermined label character to all of the blank pages of all of the half-empty blocks comprises:
   writing the predetermined label character to a predetermined bit at a beginning of all of the blank pages of all of the half-empty blocks.

3. The non-transitory computer-readable storage medium according to claim 2, wherein the predetermined label character is 0.

4. The non-transitory computer-readable storage medium according to claim 1, wherein the step of identifying the half-empty blocks containing the burn data comprises:
   searching through the blocks in the burn data of the pages in an onward order of front to back; and
   when a first page of the block contains data and any page subsequent to the first page is blank, determining the block as the half-empty block.

5. A non-transitory computer-readable storage medium with an executable program stored thereon for implementing a method for using NAND flash, the method comprising:
   when a system is powered on, determining whether a predetermined label character is present in a block of burn data of the NAND flash, the predetermined label character being used for distinguishing half-empty blocks written with the predetermined label character from other full blocks; and
   when the predetermined label character is present in the block of burn data of the NAND flash, writing valid data in the block with the predetermined label character to an empty block and erasing the block with the predetermined label character.

6. The non-transitory computer-readable storage medium according to claim 5, wherein the predetermined label character is 0.

7. The non-transitory computer-readable storage medium according to claim 5, wherein the step of determining whether the predetermined label character is present in the block of the burn data of the NAND flash comprises:
   reading a last page of the block of the burn data of the NAND flash; and
   when the predetermined label character is present in the last page, determining that the predetermined label character is present in the block of the burn data.

8. The non-transitory computer-readable storage medium according to claim 5, wherein the step of writing the valid data in the block with the predetermined label character to the empty block and erasing the block with the predetermined label character is asynchronously performed at a backstage, or is synchronously performed before responding to a writing request of the block with the predetermined label character.

9. The non-transitory computer-readable storage medium according to claim 8, wherein when the step of writing the valid data in the block with the predetermined label character to the empty block and erasing the block with the predetermined label character is asynchronously performed at the backstage, the backstage is halted from asynchronously performing the step when a number of the blocks with the predetermined label character is greater than a predetermined number within a predetermined power-on period.

10. A device including a non-transitory computer-readable storage medium with an executable program stored thereon for processing burn data of NAND flash, comprising:
    an identification module, configured to identify all half-empty blocks containing the burn data of the NAND flash, wherein the half-empty blocks includes both blank pages and non-blank pages; and
    a writing module, configured to write a predetermined label character to all of the blank pages of all of the half-empty blocks to convert the half-empty blocks to full blocks, wherein the full blocks includes only noneblank pages, and the predetermined label character is used for distinguishing the block written with the predetermined label character from other full blocks.

11. The device according to claim 10, wherein the writing module writes the predetermined label character to a predetermined bit at a beginning of all of the blank pages of all of the half-empty blocks.

12. The device according to claim 11, wherein the predetermined label character is 0.

13. The device according to claim 10, wherein the identification module searches through the blocks containing the burn data of the pages in an onward order of front to back; when a first page of the block contains data and any page subsequent to the first page is blank, the identification module determines that the block is the half-empty block.

* * * * *